(12) United States Patent
Kono

(10) Patent No.: US 9,634,136 B2
(45) Date of Patent: Apr. 25, 2017

(54) SEMICONDUCTOR DEVICE

(71) Applicant: Kabushiki Kaisha Toshiba, Minato-ku, Tokyo (JP)

(72) Inventor: Hiroshi Kono, Himeji Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/070,854

(22) Filed: Mar. 15, 2016

(65) Prior Publication Data

US 2017/0077289 A1 Mar. 16, 2017

(30) Foreign Application Priority Data

Sep. 14, 2015 (JP) ................................. 2015-180504

(51) Int. Cl.
*H01L 29/94* (2006.01)
*H01L 29/78* (2006.01)
*H01L 29/16* (2006.01)
*H01L 29/06* (2006.01)
*H01L 29/10* (2006.01)

(52) U.S. Cl.
CPC ...... *H01L 29/7813* (2013.01); *H01L 29/0634* (2013.01); *H01L 29/1095* (2013.01); *H01L 29/1608* (2013.01)

(58) Field of Classification Search
CPC ............. H01L 29/7813; H01L 29/0696; H01L 29/0865; H01L 29/0634; H01L 29/1095; H01L 29/7811; H01L 29/7802
See application file for complete search history.

(56) References Cited

U.S. PATENT DOCUMENTS

| 8,592,893 B2 | 11/2013 | Saito et al. | |
|---|---|---|---|
| 8,592,917 B2 | 11/2013 | Ono et al. | |
| 8,829,608 B2 | 9/2014 | Saito et al. | |
| 2004/0191996 A1* | 9/2004 | Takaishi | H01L 29/7813 438/270 |
| 2006/0216896 A1* | 9/2006 | Saito | H01L 29/4236 438/270 |
| 2007/0013000 A1* | 1/2007 | Shiraishi | H01L 29/0634 257/341 |
| 2009/0114969 A1* | 5/2009 | Suzuki | H01L 29/0619 257/301 |
| 2014/0048872 A1* | 2/2014 | Hsieh | H01L 29/7827 257/331 |

FOREIGN PATENT DOCUMENTS

JP  2012-164707 A  8/2012

* cited by examiner

*Primary Examiner* — Earl Taylor
*Assistant Examiner* — Samuel Park
(74) *Attorney, Agent, or Firm* — White & Case LLP

(57) ABSTRACT

A semiconductor device according to an embodiment includes a SiC layer having a first plane and a second plane, a first SiC region of a first conductivity type which is provided in the SiC layer, first and second pillar regions of a second conductivity type, third and fourth pillar regions of a second conductivity type which are provided between the first and second pillar regions and the first plane, a gate electrode provided between the third pillar region and the fourth pillar region, first and second body regions of the second conductivity type, a gate insulating film, fifth and sixth pillar regions provided between the third and fourth pillar regions and the gate electrode, first and second source regions of the first conductivity type.

20 Claims, 3 Drawing Sheets

SEMICONDUCTOR DEVICE

CROSS-REFERENCE TO RELATED APPLICATION

This application is based upon and claims the benefit of priority from Japanese Patent Application No. 2015-180504, filed on Sep. 14, 2015, the entire contents of which are incorporated herein by reference.

FIELD

Embodiments described herein relate generally to semiconductor devices.

BACKGROUND

Silicon carbide (SiC) is expected to be used as a material for a next-generation semiconductor device. SiC has the following physical properties: a band gap is three times wider than that of silicon (Si); breakdown field strength is about ten times more than that of Si; and thermal conductivity is about three times more than that of Si. The use of these characteristics makes it possible to achieve a semiconductor device which has low power consumption and can operate at a high temperature.

A trench-gate metal oxide semiconductor field effect transistor (MOSFET) in which a gate electrode is provided in a trench has been known as a structure for reducing an on-resistance of the MOSFET using SiC. In the trench-gate MOSFET, there is a concern that the breakdown of a gate insulating film will occur due to the concentration of the electric field at the bottom of the trench.

DETAILED DESCRIPTION

Figure 1:
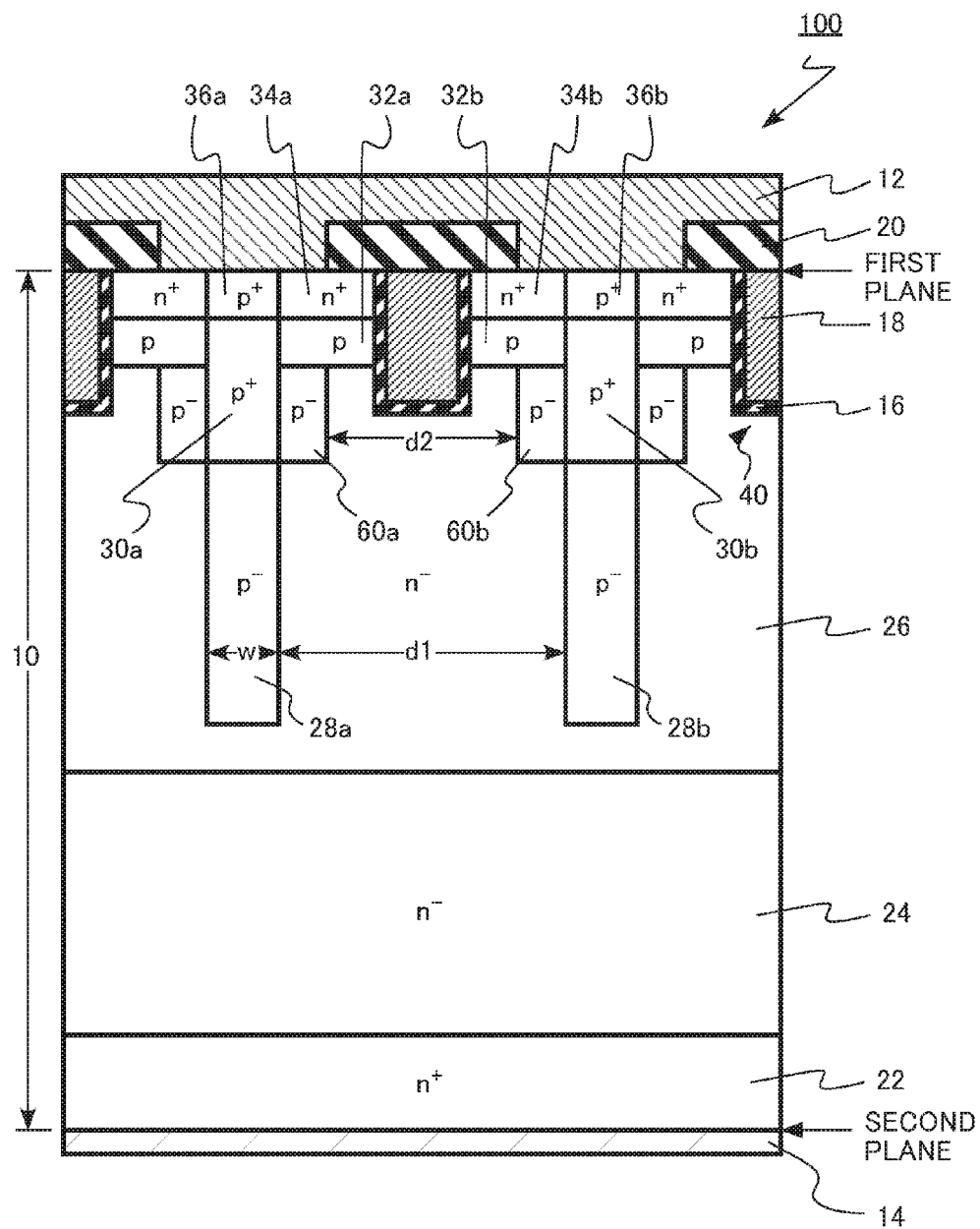
FIG. 1 is a cross-sectional view schematically illustrating a semiconductor device according to a first embodiment.

A semiconductor device according to an embodiment includes: a SiC layer which has a first plane and a second plane; a first SiC region of a first conductivity type which is provided in the SiC layer; a first pillar region of a second conductivity type which is provided in the first SiC region; a second pillar region of the second conductivity type which is provided in the first SiC region; a third pillar region of the second conductivity type which is provided between the first pillar region and the first plane and has a higher second-conductivity-type impurity concentration than the first pillar region; a fourth pillar region of the second conductivity type which is provided between the second pillar region and the first plane and has a higher second-conductivity-type impurity concentration than the second pillar region; a gate electrode which has at least a portion provided between the third pillar region and the fourth pillar region; a first body region of the second conductivity type which is provided between the first SiC region and the first plane and has a lower second-conductivity-type impurity concentration than the third pillar region; a second body region of the second conductivity type which is provided between the first SiC region and the first plane and has a lower second-conductivity-type impurity concentration than the fourth pillar region; a gate insulating film which is provided between the first body region and the gate electrode and between the second body region and the gate electrode, the depth of an end of the gate insulating film, which is close to the second plane, from the first plane being less than the depth of the third pillar region and the fourth pillar region from the first plane; a fifth pillar region of the second conductivity type which is provided between the third pillar region and the gate electrode so as to come into contact with the third pillar region, faces the gate electrode with the first SiC region interposed therebetween, and has a lower second-conductivity-type impurity concentration than the third pillar region; a sixth pillar region of the second conductivity type which is provided between the fourth pillar region and the gate electrode so as to come into contact with the fourth pillar region, faces the gate electrode with the first SiC region interposed therebetween, and has a lower second-conductivity-type impurity concentration than the fourth pillar region; a first source region of the first conductivity type which is provided between the first body region and the first plane; and a second source region of the first conductivity type which is provided between the second body region and the first plane.

Hereinafter, embodiments of the invention will be described with reference to the drawings. In the following description, for example, the same or similar members are denoted by the same reference numerals and the description thereof will not be repeated.

In the following description, $n^+$, $n$, $n^-$, $p^+$, $p$, and $p^-$ indicate the relative impurity concentrations of each conductivity type. That is, $n^+$ indicates an n-type impurity concentration that is relatively higher than that of n and $n^-$ indicates an n-type impurity concentration that is relatively lower than that of n. In addition, $p^+$ indicates a p-type impurity concentration that is relatively higher than that of p and $p^-$ indicates a p-type impurity concentration that is relatively lower than that of p. In some cases, an $n^+$ type and an $n^-$ type are simply referred to as an n type and a $p^+$ type and a $p^-$ type are simply referred to as a p type.

In the specification, a "pillar region" is a SiC region which is provided in a SiC layer. The "pillar region" is a SiC region which has, for example, a columnar shape or a plate shape and is long in the thickness direction of the SiC layer.

First Embodiment

A semiconductor device according to a first embodiment includes: a SiC layer which has a first plane and a second plane; a first SiC region of a first conductivity type which is provided in the SiC layer; a first low-concentration pillar region of a second conductivity type which is provided in the first SiC region; a second low-concentration pillar region of the second conductivity type which is provided in the first SiC region; a first high-concentration pillar region of the second conductivity type which is provided between the first low-concentration pillar region and the first plane and has a higher second-conductivity-type impurity concentration than the first low-concentration pillar region; a second high-concentration pillar region of the second conductivity type which is provided between the second low-concentration pillar region and the first plane and has a higher second-conductivity-type impurity concentration than the second low-concentration pillar region; a gate electrode which has at least a portion provided between the first high-concentration pillar region and the second high-concentration pillar region; a first body region of the second conductivity type which is provided between the first SiC region and the first plane and has a lower second-conductivity-type impurity concentration than the first high-concentration pillar region; a second body region of the second conductivity type which is provided between the first SiC region and the first plane and has a lower second-conductivity-type impurity concentration than the second high-concentration pillar region; a gate insulating film which is provided between the first body region and the gate electrode and between the second body region and the gate electrode, the depth of an end of the gate insulating film, which is close to the second plane, from the first plane being less than the depth of the first high-concentration pillar region and the second high-concentration pillar region from the first plane; a first side pillar region of the second conductivity type which is provided between the first high-concentration pillar region and the gate electrode so as to come into contact with the first high-concentration pillar region, faces the gate electrode with the first SiC region interposed therebetween, and has a lower second-conductivity-type impurity concentration than the first high-concentration pillar region; a second side pillar region of the second conductivity type which is provided between the second high-concentration pillar region and the gate electrode so as to come into contact with the second high-concentration pillar region, faces the gate electrode with the first SiC region interposed therebetween, and has a lower second-conductivity-type impurity concentration than the second high-concentration pillar region; a first source region of the first conductivity type which is provided between the first body region and the first plane; and a second source region of the first conductivity type which is provided between the second body region and the first plane.

FIG. 1 is a cross-sectional view schematically illustrating the semiconductor device according to this embodiment. The semiconductor device according to this embodiment is a vertical trench-gate MOSFET 100 using silicon carbide (SiC). Hereinafter, an example in which a first conductivity type is an n type and a second conductivity is a p type will be described.

The MOSFET 100 includes a SiC layer 10, a source electrode 12, a drain electrode 14, a gate insulating film 16, a gate electrode 18, an interlayer insulating film 20, and a trench 40. The SiC layer 10 includes a n⁺-type drain region (third SiC region) 22, an n⁻-type first drift region (second SiC region) 24, an n⁻-type second drift region (first SiC region) 26, a p⁻-type first low-concentration pillar region (first pillar region) 28a, a p⁻-type second low-concentration pillar region (second pillar region) 28b, a p⁺-type first high-concentration pillar region (third pillar region) 30a, a p⁺-type second high-concentration pillar region (fourth pillar region) 30b, a p-type first body region 32a, a p-type second body region 32b, an n⁺-type first source region 34a, an n⁺-type second source region 34b, a p⁺-type first contact region 36a, a p⁺-type second contact region 36b, a p⁻-type first side pillar region (fifth pillar region) 60a, and a p⁻-type second side pillar region (sixth pillar region) 60b.

The SiC layer 10 is a single crystal SiC layer. The SiC layer 10 is, for example, a 4H—SiC layer.

The SiC layer 10 has a first plane and a second plane. Hereinafter, the first plane is also referred to as a front surface and the second plane is also referred to as a rear surface. Hereinafter, the term "depth" means a depth from the first plane.

For example, the first plane is inclined at an angle that is equal to or greater than 0° and equal to or less than 8° with respect to the (0001) face. For example, the second plane is inclined at an angle that is equal to or greater than 0° and equal to or less than 8° with respect to the (000-1) face. The (0001) face is referred to as a silicon face. The (000-1) face is referred to as a carbon face.

The n⁺-type drain region 22 is provided on the rear surface of the SiC layer 10. The drain region 22 includes, for example, nitrogen (N) as n-type impurities. The n-type impurity concentration of the drain region 22 is, for example, equal to or greater than $1 \times 10^{18}$ cm⁻³ and equal to or less than $1 \times 10^{21}$ cm⁻³.

The n⁻-type first drift region 24 is provided on the drain region 22. The first drift region 24 is provided between the second drift region 26 and the rear surface of the SiC layer 10.

The first drift region 24 includes, for example, nitrogen (N) as n-type impurities. The n-type impurity concentration of the first drift region 24 is lower than the n-type impurity concentration of the second drift region 26. The n-type impurity concentration of the first drift region 24 is, for example, equal to or greater than $4 \times 10^{14}$ cm⁻³ and equal to or less than $6 \times 10^{16}$ cm⁻³. The thickness of the first drift region 24 is, for example, equal to or greater than 0.1 μm and equal to or less than 150 μm.

The n⁻-type second drift region 26 is provided on the first drift region 24.

The second drift region 26 includes, for example, nitrogen (N) as n-type impurities. The n-type impurity concentration of the second drift region 26 is, for example, equal to or greater than $5 \times 10^{16}$ cm⁻³ and equal to or less than $5 \times 10^{17}$ cm⁻³. The thickness of the second drift region 26 is, for example, equal to or greater than 3 μm and equal to or less than 10 μm.

The p⁻-type first low-concentration pillar region 28a is provided in the second drift region 26. The first low-concentration pillar region 28a includes, for example, aluminum (Al) as p-type impurities. The p-type impurity concentration of the first low-concentration pillar region 28a is, for example, equal to or greater than $1 \times 10^{16}$ cm⁻³ and equal to or less than $1 \times 10^{18}$ cm⁻³.

The depth of the first low-concentration pillar region 28a is, for example, equal to or greater than 2 μm and equal to or less than 10 μm. The width ("w" in FIG. 1) of the first low-concentration pillar region 28a is, for example, equal to or greater than 0.5 μm and equal to or less than 2.5 μm.

The p⁻-type second low-concentration pillar region 28b is provided in the second drift region 26. The second low-concentration pillar region 28b includes, for example, aluminum (Al) as p-type impurities. The p-type impurity concentration of the second low-concentration pillar region 28b is, for example, equal to or greater than $1 \times 10^{16}$ cm⁻³ and equal to or less than $1 \times 10^{18}$ cm⁻³.

The depth of the second low-concentration pillar region 28b is, for example, equal to or greater than 2 μm and equal to or less than 10 μm. The width of the second low-concentration pillar region 28b is, for example, equal to or greater than 0.5 μm and equal to or less than 2.5 μm.

The first low-concentration pillar region 28a and the second low-concentration pillar region 28b have the same shape and impurity concentration in a production tolerance range. The distance ("d1" in FIG. 1) between the first low-concentration pillar region 28a and the second low-concentration pillar region 28b is, for example, equal to or greater than 0.5 μm and equal to or less than 3.0 μm.

When the difference between the n-type impurity concentration and the p-type impurity concentration of the first low-concentration pillar region 28a is $N_1$, the width of the first low-concentration pillar region 28a is w, the difference between the p-type impurity concentration and the n-type impurity concentration of the second drift region 26 provided between the first low-concentration pillar region 28a and the second low-concentration pillar region 28b is $N_2$, and the distance between the first low-concentration pillar region 28a and the second low-concentration pillar region 28b is d1, $N_1w/N_2d1$ is, for example, equal to or greater than 0.8 and equal to or less than 1.5.

The p-type impurity concentration of the first low-concentration pillar region 28a and the n-type impurity concentration of the second drift region 26 are, for example, an average concentration. The average concentration is obtained by measuring impurity concentrations at a plurality of points and calculating the average value of the impurity concentrations.

The $p^+$-type first high-concentration pillar region 30a is provided between the first low-concentration pillar region 28a and the front surface of the SiC layer 10. The first high-concentration pillar region 30a is provided so as to come into contact with the first low-concentration pillar region 28a.

The first high-concentration pillar region 30a includes, for example, aluminum (Al) as p-type impurities. The p-type impurity concentration of the first high-concentration pillar region 30a is higher than the p-type impurity concentration of the first low-concentration pillar region 28a. The p-type impurity concentration of the first high-concentration pillar region 30a is, for example, equal to or greater than $1\times10^{13}$ $cm^{-3}$ and equal to or less than $5\times10^{20}$ $cm^{-3}$.

The depth of the first high-concentration pillar region 30a is greater than the depth of the trench 40. The depth of the first high-concentration pillar region 30a is, for example, equal to or greater than 1 μm and equal to or less than 3 μm. The width of the first high-concentration pillar region 30a is, for example, equal to or greater than 0.5 μm and equal to or less than 1.5 μm.

The $p^+$-type second high-concentration pillar region 30b is provided between the second low-concentration pillar region 28b and the front surface of the SiC layer 10. The second high-concentration pillar region 30b is provided so as to come into contact with the second low-concentration pillar region 28b.

The second high-concentration pillar region 30b includes, for example, aluminum (Al) asp-type impurities. The p-type impurity concentration of the second high-concentration pillar region 30b is higher than the p-type impurity concentration of the second low-concentration pillar region 28b. The p-type impurity concentration of the second high-concentration pillar region 30b is, for example, equal to or greater than $1\times10^{13}$ $cm^{-3}$ and equal to or less than $5\times10^{20}$ $cm^{-3}$.

The depth of the second high-concentration pillar region 30b is greater than the depth of the trench 40. The depth of the second high-concentration pillar region 30b is, for example, equal to or greater than 1 μm and equal to or less than 3 μm. The width of the second high-concentration pillar region 30b is, for example, equal to or greater than 0.5 μm and equal to or less than 1.5 μm.

The first high-concentration pillar region 30a and the second high-concentration pillar region 30b have the same shape and impurity concentration in a production tolerance range.

The $p^-$-type first side pillar region 60a is provided between the first high-concentration pillar region 30a and the gate electrode 18 so as to come into contact with the first high-concentration pillar region 30a. The first side pillar region 60a is provided between the first high-concentration pillar region 30a and the second drift region 26. The first side pillar region 60a comes into contact with the first high-concentration pillar region 30a. The second drift region 26 is interposed between the first side pillar region 60a and the gate electrode 18.

The first side pillar region 60a includes, for example, aluminum (Al) as p-type impurities. The p-type impurity concentration of the first side pillar region 60a is lower than the p-type impurity concentration of the first high-concentration pillar region 30a. The p-type impurity concentration of the first side pillar region 60a is, for example, equal to or greater than $1\times10^{16}$ $cm^{-3}$ and equal to or less than $1\times10^{18}$ $cm^{-3}$.

The depth of the first side pillar region 60a is greater than the depth of a second-plane-side end of the gate insulating film 16. The depth of the first side pillar region 60a is greater than the depth of the trench 40. The depth of the first side pillar region 60a is, for example, equal to or greater than 1 μm and equal to or less than 3 μm. The width of the first side pillar region 60a is, for example, equal to or greater than 0.1 μm and equal to or less than 0.5 μm.

The depth of the first side pillar region 60a may be less than or greater than the depth of the first high-concentration pillar region 30a. It is preferable that the depth of the first side pillar region 60a be greater than the depth of the first high-concentration pillar region 30a in order to suppress the breakdown of the gate insulating film due to the concentration of the electric field on the bottom of the trench.

The $p^-$-type second side pillar region 60b is provided between the second high-concentration pillar region 30b and the gate electrode 18 so as come into contact with the second high-concentration pillar region 30b. The second side pillar region 60b is provided between the second high-concentration pillar region 30b and the second drift region 26. The second side pillar region 60b comes into contact with the second high-concentration pillar region 30b. The second drift region 26 is interposed between the second side pillar region 60b and the gate electrode 18.

The second side pillar region 60b includes, for example, aluminum (Al) as p-type impurities. The p-type impurity concentration of the second side pillar region 60b is lower than the p-type impurity concentration of the second high-concentration pillar region 30b. The p-type impurity concentration of the second side pillar region 60b is, for example, equal to or greater than $1\times10^{16}$ $cm^{-3}$ and equal to or less than $1\times10^{18}$ $cm^{-3}$.

The depth of the second side pillar region 60b is greater than the second-plane-side end of the gate insulating film 16. The depth of the second side pillar region 60b is greater than the depth of the trench 40. The depth of the second side pillar region 60b is, for example, equal to or greater than 1 μm and equal to or less than 3 μm. The width of the second side pillar region 60b is, for example, equal to or greater than 0.1 μm and equal to or less than 0.5 μm.

The depth of the second side pillar region 60b may be less than or greater than the depth of the second high-concentration pillar region 30b. It is preferable that the depth of the second side pillar region 60b be greater than the depth of the second high-concentration pillar region 30b in order to suppress the breakdown of the gate insulating film due to the concentration of the electric field on the bottom of the trench.

The distance ("d2" in FIG. 1) between the first side pillar region 60a and the second side pillar region 60b is less than the distance ("d1" in FIG. 1) between the first low-concentration pillar region 28a and the second low-concentration pillar region 28b.

The p-type first body region 32a is provided between the second drift region 26 and the front surface of the SiC layer 10. The first body region 32a is provided between the first high-concentration pillar region 30a and the gate electrode 18. The first body region 32a functions as a channel region of the MOSFET 100.

The first body region 32a includes, for example, aluminum (Al) as p-type impurities. The p-type impurity concentration of the first body region 32a is lower than the p-type impurity concentration of the first high-concentration pillar region 30a. The p-type impurity concentration of the first body region 32a is, for example, equal to or greater than $1 \times 10^{17}$ cm$^{-3}$ and equal to or less than $5 \times 10^{18}$ cm$^{-3}$. The depth of the first body region 32a is, for example, equal to or greater than 0.3 μm and equal to or less than 0.8 μm.

The p-type second body region 32b is provided between the second drift region 26 and the front surface of the SiC layer 10. The second body region 32b is provided between the second high-concentration pillar region 30b and the gate electrode 18. The second body region 32b functions as a channel region of the MOSFET 100.

The second body region 32b includes, for example, aluminum (Al) as p-type impurities. The p-type impurity concentration of the second body region 32b is lower than the p-type impurity concentration of the second high-concentration pillar region 30b. The p-type impurity concentration of the second body region 32b is, for example, equal to or greater than $1 \times 10^{17}$ cm$^{-3}$ and equal to or less than $5 \times 10^{8}$ cm$^{-3}$. The depth of the second body region 32b is, for example, equal to or greater than 0.3 μm and equal to or less than 0.8 μm.

The first body region 32a and the second body region 32b have the same shape and impurity concentration in a production tolerance range.

The n$^+$-type first source region 34a is provided between the first body region 32a and the front surface of the SiC layer 10. At least a portion of the first source region 34a is provided in the front surface of the SiC layer 10.

The first source region 34a includes, for example, phosphor (P) as n-type impurities. The n-type impurity concentration of the first source region 34a is, for example, equal to or greater than $1 \times 10^{19}$ cm$^{-3}$ and equal to or less than $1 \times 10^{2}$ cm$^{-3}$. The depth of the first source region 34a is less than the depth of the first body region 32a and is, for example, equal to or greater than 0.1 μm and equal to or less than 0.4 μm.

The n$^+$-type second source region 34b is provided between the second body region 32b and the front surface of the SiC layer 10. At least a portion of the second source region 34b is provided in the front surface of the SiC layer 10.

The second source region 34b includes, for example, phosphor (P) as n-type impurities. The n-type impurity concentration of the second source region 34b is, for example, equal to or greater than $1 \times 10^{19}$ cm$^{-3}$ and equal to or less than $1 \times 10^{21}$ cm$^{-3}$. The depth of the second source region 34b is less than the depth of the second body region 32b and is, for example, equal to or greater than 0.1 μm and equal to or less than 0.4 μm.

The first source region 34a and the second source region 34b have the same shape and impurity concentration in a production tolerance range.

The p$^+$-type first contact region 36a is provided between the first high-concentration pillar region 30a and the front surface of the SiC layer 10 so as to come into contact with the front surface of the SiC layer 10. The first contact region 36a is provided so as to come into contact with, for example, the first high-concentration pillar region 30a. The first contact region 36a is provided so as to come into contact with the first source region 34a.

The first contact region 36a includes, for example, aluminum (Al) as p-type impurities. The p-type impurity concentration of the first contact region 36a is, for example, equal to or greater than $1 \times 10^{19}$ cm$^{-3}$ and equal to or less than $1 \times 10^{21}$ cm$^{-3}$.

The depth of the first contact region 36a is less than the depth of the first body region 32a and is, for example, equal to or greater than 0.1 μm and equal to or less than 0.4 μm.

The p$^+$-type second contact region 36b is provided between the second high-concentration pillar region 30b and the front surface of the SiC layer 10 so as to come into contact with the front surface of the SiC layer 10. The second contact region 36b is provided so as to come into contact with, for example, the second high-concentration pillar region 30b. The second contact region 36b is provided so as to come into contact with the second source region 34b.

The second contact region 36b includes, for example, aluminum (Al) as p-type impurities. The p-type impurity concentration of the second contact region 36b is, for example, equal to or greater than $1 \times 10^{19}$ cm$^{-3}$ and equal to or less than $1 \times 10^{21}$ cm$^{-3}$.

The depth of the second contact region 36b is less than the depth of the second body region 32b and is, for example, equal to or greater than 0.1 μm and equal to or less than 0.4 μm.

The first contact region 36a and the second contact region 36b have the same shape and impurity concentration in a production tolerance range.

The gate electrode 18 is provided in the trench 40 which is formed in the SiC layer 10. The gate electrode 18 is provided on the gate insulating film 16. At least a portion of the gate electrode 18 is provided between the first high-concentration pillar region 30a and the second high-concentration pillar region 30b.

The gate electrode 18 is a conductive layer. The gate electrode 18 is, for example, a polysilicon film including p-type impurities or n-type impurities.

The gate insulating film 16 is provided in the trench 40. The gate insulating film 16 is provided between the first and second body regions 32a and 32b and the gate electrode 18. The depth of the end of the gate insulating film 16 which is close to the rear surface of the SiC layer is less than the depth of the first high-concentration pillar region 30a and the second high-concentration pillar region 30b. In other words, the depth of the trench 40 is less than the depth of the first high-concentration pillar region 30a and the second high-concentration pillar region 30b.

The gate insulating film 16 is, for example, a silicon oxide film. For example, a high-k insulating film (high-permittivity insulating film) can be applied as the gate insulating film 16.

The interlayer insulating film 20 is provided on the gate electrode 18. The interlayer insulating film 20 is, for example, a silicon oxide film.

The source electrode 12 is provided on the front surface of the SiC layer 10. The source electrode 12 is electrically connected to the first source region 34a, the second source region 34b, the first contact region 36a, the second contact region 36b, the first high-concentration pillar region 30a, and the second high-concentration pillar region 30b. The source electrode 12 comes into contact with the first source region 34a, the second source region 34b, the first contact region 36a, and the second contact region 36b.

The source electrode 12 includes metal. Metal forming the source electrode 12 has, for example, a laminated structure of titanium (Ti) and aluminum (Al). The source electrode 12 may include metal silicide or metal carbide which comes into contact with the SiC layer 10.

The drain electrode 14 is provided on the rear surface of the SiC layer 10. The drain electrode 14 is electrically connected to the drain region 22.

The drain electrode 14 is made of, for example, metal or a metal semiconductor compound. The drain electrode 14 includes a material which is selected from a group consisting of, for example, nickel silicide (NiSi), titanium (Ti), nickel (Ni), silver (Ag), and gold (Au).

The impurity concentration of each region in the SiC layer 10 can be measured by, for example, secondary ion mass spectrometry (SIMS). In addition, the width, shape, and depth of each region in the SiC layer 10 can be measured by, for example, scanning capacitance microscopy (SCM). The magnitude relationship between the impurity concentrations of each region in the SiC layer 10 can be determined by, for example, SCM.

Next, the function and effect of the semiconductor device according to the embodiment will be described.

In the trench-gate MOSFET 100 according to this embodiment, it is possible to perform scaling-down, as compared to a planar MOSFET, and thus to increase channel density. Therefore, the on-resistance of the MOSFET is reduced. However, there is a problem that the breakdown of the gate insulating film occurs due to the concentration of the electric field on the bottom of the trench.

In this embodiment, the p$^+$-type first high-concentration pillar region 30a and the p$^+$-type second high-concentration pillar region 30b which are deeper than the trench 40 are provided on both sides of the trench 40. The concentration of the electric field on the gate insulating film 16 provided at the bottom of the trench 40 is reduced by a depletion layer which is spread from the p$^+$-type first high-concentration pillar region 30a and the p$^+$-type second high-concentration pillar region 30b to the n$^-$-type second drift region 26. Therefore, the breakdown of the gate insulating film due to the concentration of the electric field on the bottom of the trench is suppressed.

However, since the first high-concentration pillar region 30a and the second high-concentration pillar region 30b are provided so as to be deeper than the trench 40, the effective width of the drift region is narrowed, which causes an increase in on-resistance. In addition, since the distance between the first and second high-concentration pillar regions 30a and 30b and the second plane is short, a breakdown voltage is reduced.

In the MOSFET 100 according to this embodiment, the drift region has a two-layer structure of the first drift region 24 with low concentration and the second drift region 26 with high concentration. Since the second drift region 26 with high concentration has low resistance, an increase in the on-resistance is suppressed.

However, in the second drift region 26 with high concentration, electric field strength is high, which causes a reduction in the breakdown voltage. Therefore, in this embodiment, since the p$^-$-type first low-concentration pillar region 28a and the p$^-$-type second low-concentration pillar region 28b are provided in the second drift region 26, at least a portion of the second drift region 26 is depleted to reduce electric field strength. As a result, a reduction in the breakdown voltage is suppressed.

According to the MOSFET 100, it is possible to suppress the breakdown of the gate insulating film 16, an increase in the on-resistance, and a reduction in the breakdown voltage.

Figure 2:
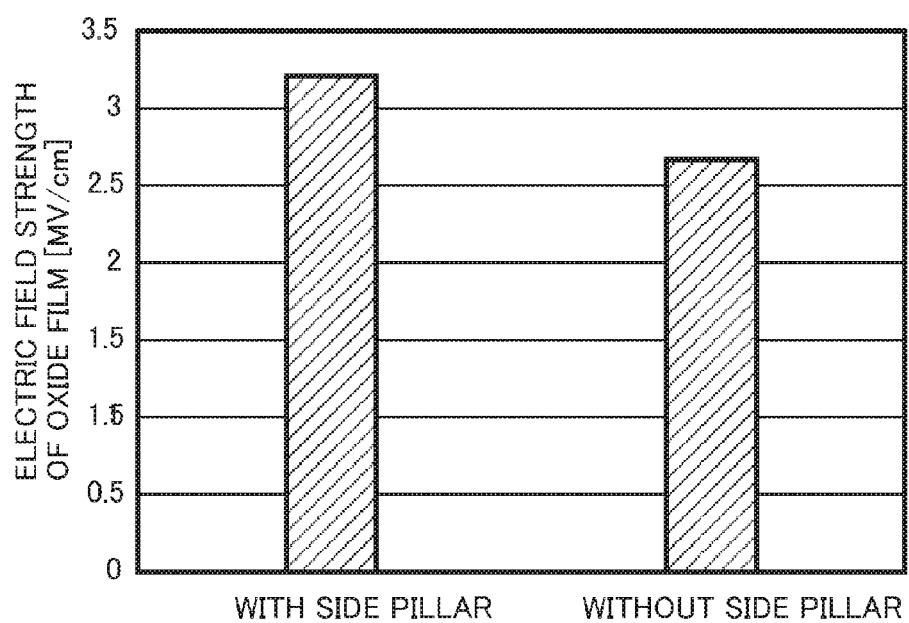
FIG. 2 is a diagram illustrating the function and effect of the semiconductor device according to the first embodiment.

FIG. 2 is a diagram illustrating the function and effect of the semiconductor device according to this embodiment. FIG. 2 is a diagram illustrating the simulation results of electric field strength applied to the gate insulating film (oxide film) 16 when the first and second side pillar regions 60a and 60b are provided. FIG. 2 illustrates the calculation results when the concentration of the first and second side pillar regions 60a and 60b is $5 \times 10^{17}$ cm$^{-3}$ and the width thereof is 0.1 μm. For comparison, FIG. 2 also illustrates the calculation results when the first and second side pillar regions 60a and 60b are not provided.

As can be seen from FIG. 2, when the first and second side pillar regions 60a and 60b are provided, the electric field strength applied to the gate insulating film 16 is about 0.5 MV/cm less than that when the first and second side pillar regions 60a and 60b are not provided.

As such, in the MOSFET 100 according to this embodiment, since the first and second side pillar regions 60a and 60b are provided, the first and second side pillar regions 60a and 60b are depleted in an off state to reduce electric field strength. When the first and second side pillar regions 60a and 60b are not provided, the electric field strength is reduced only by the impurity concentrations of the first and second low-concentration pillar regions 28a and 28b and the first and second high-concentration pillar regions 30a and 30b. In this embodiment, since the depletion of the first and second side pillar regions 60a and 60b contributes to reducing the electric field strength of the gate insulating film 16, it is possible to reduce the electric field strength of the gate insulating film.

In a case in which the first and second side pillar regions 60a and 60b are not provided, when the electric field strength applied to the gate insulating film 16 is reduced, it is considered that the distance between the first and second high-concentration pillar regions 30a and 30b and the trench 40 is reduced. However, in this case, since the first and second high-concentration pillar regions 30a and 30b with a high impurity concentration are close to the trench, there is a concern that the on-resistance will increase. In this embodiment, since the first and second side pillar regions 60a and 60b having a lower impurity concentration than the first and second high-concentration pillar regions 30a and 30b are provided, the electric field strength applied to the gate insulating film 16 is reduced and it is possible to suppress an increase in the on-resistance.

In the MOSFET 100 according to this embodiment, it is preferable that the p$^+$-type first high-concentration pillar region 30a and the p$^+$-type first contact region 36a come into contact with each other. In addition, it is preferable that the p$^+$-type second high-concentration pillar region 30b and the p$^+$-type second contact region 36b come into contact with each other.

When the MOSFET 100 is turned off, avalanche breakdown occurs at the maximum electric field strength point in the first or second low-concentration pillar region 28a or 28b, or the first or second high-concentration pillar region 30a or 30b. In a case in which avalanche breakdown occurs in the first or second low-concentration pillar region 28a or 28b, or the first or second high-concentration pillar region 30a or 30b, when the resistance of a path from the point where the avalanche breakdown occurs to the source electrode 12 is high, carriers are not sufficiently moved to the source electrode 12 and the breakdown of the device is likely to occur.

In this embodiment, the first high-concentration pillar region 30a comes into contact with the first contact region 36a, and the second high-concentration pillar region 30b comes into contact with the second contact region 36b. Therefore, the resistance of a path from the first or second low-concentration pillar region 28a or 28b or the first or second high-concentration pillar region 30a or 30b to the source electrode 12 is lower than that, for example, in a case in which the first or second body region 32a or 32b with a low impurity concentration is interposed between the first or second low-concentration pillar region 28a or 28b and the first or second contact region 36a or 36b. As a result, the breakdown of the device is suppressed and avalanche resistance is improved.

As described above, according to the MOSFET 100 of this embodiment, it is possible to suppress an increase in on-resistance, a reduction in breakdown voltage, and the breakdown of a gate insulating film.

Second Embodiment

A semiconductor device according to a second embodiment differs from the semiconductor device according to the first embodiment except that the distance between the first side pillar region 60a and the second side pillar region 60b is substantially equal to the distance between the first low-concentration pillar region 28a and the second low-concentration pillar region 28b. Hereinafter, the description of the same content as that in the first embodiment will not be repeated.

Figure 3:
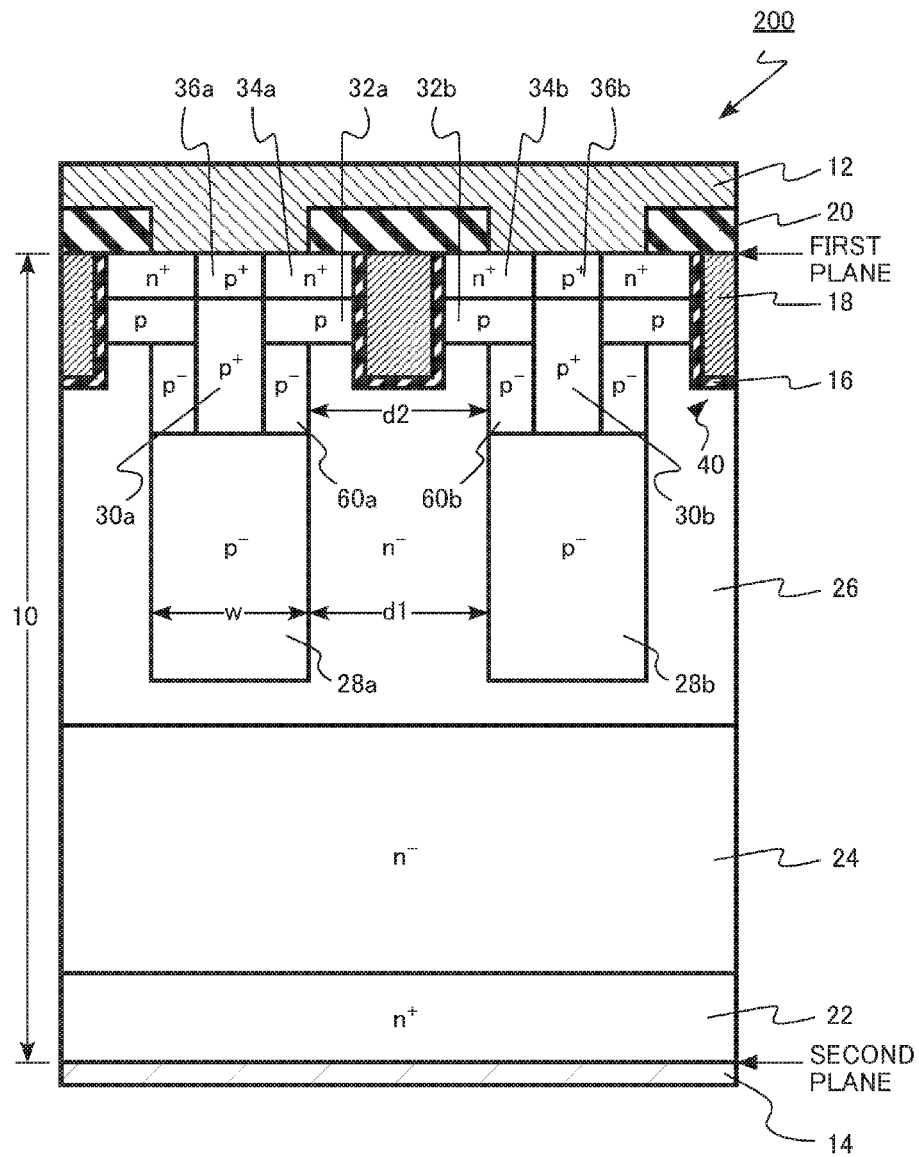
FIG. 3 is a cross-sectional view schematically illustrating a semiconductor device according to a second embodiment.

FIG. 3 is a cross-sectional view schematically illustrating the semiconductor device according to this embodiment. The semiconductor device according to this embodiment is a vertical trench-gate MOSFET 200 using silicon carbide (SiC). Hereinafter, an example in which a first conductivity type is an n type and a second conductivity is a p type will be described.

In the MOSFET 200, the distance ("d2" in FIG. 3) between the first side pillar region 60a and the second side pillar region 60b is substantially equal to the distance ("d1" in FIG. 3) between the first low-concentration pillar region 28a and the second low-concentration pillar region 28b.

The first side pillar region 60a is provided between the first low-concentration pillar region 28a and the first body region 32a so as to come into contact with the first low-concentration pillar region 28a and the first body region 32a. The second side pillar region 60b is provided between the second low-concentration pillar region 28b and the second body region 32b so as to come into contact with the second low-concentration pillar region 28b and the second body region 32b.

According to the MOSFET 200 of this embodiment, an increase in on-resistance, a reduction in breakdown voltage, and the breakdown of a gate insulating film can be suppressed by the same function as that in the first embodiment.

In the first and second embodiments, the crystal structure of SiC is 4H—SiC. However, the invention can also be applied to devices using SiC with other crystal structures such as 6H—SiC and 3C—SiC. In addition, faces other than the (0001) face can be applied to the front surface of the SiC layer 10.

In the first and second embodiments, the first conductivity is an n type and the second conductivity is a p type. However, the first conductivity may be a p type and the second conductivity may be an n type.

In the first and second embodiments, aluminum (Al) is given as an example of the p-type impurities. However, boron (B) may be used as the p-type impurities. In addition, nitrogen (N) and phosphor (P) are given as examples of the n-type impurities. However, for example, arsenic (As) and antimony (Sb) may be used as the n-type impurities.

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a SiC layer having a first plane and a second plane;
a first SiC region of a first conductivity type provided in the SiC layer;
a first pillar region of a second conductivity type provided in the first SiC region;
a second pillar region of the second conductivity type provided in the first SiC region;
a third pillar region of the second conductivity type provided between the first pillar region and the first plane, the third pillar region having a higher second conductivity type impurity concentration than the first pillar region;
a fourth pillar region of the second conductivity type provided between the second pillar region and the first plane, the fourth pillar region having a higher second conductivity type impurity concentration than the second pillar region;
a gate electrode having at least a portion provided between the third pillar region and the fourth pillar region;
a first body region of the second conductivity type provided between the first SiC region and the first plane, the first body region having a lower second conductivity type impurity concentration than the third pillar region;
a second body region of the second conductivity type provided between the first SiC region and the first plane, the second body region having a lower second conductivity type impurity concentration than the fourth pillar region;
a gate insulating film provided between the first body region and the gate electrode and between the second body region and the gate electrode, a distance between the first plane and an end of the gate insulating film close to the second plane being less than distances between the first plane and ends of the third pillar region and the fourth pillar region close to the second plane;
a fifth pillar region of the second conductivity type provided between the third pillar region and the gate electrode, the fifth pillar region being in contact with the third pillar region, the fifth pillar region facing the gate electrode with the first SiC region interposed therebetween and the fifth pillar region having a lower second conductivity type impurity concentration than the third pillar region;
a sixth pillar region of the second conductivity type provided between the fourth pillar region and the gate electrode, the sixth pillar region being in contact with the fourth pillar region, the sixth pillar region facing the gate electrode with the first SiC region interposed therebetween and the sixth pillar region having a lower second conductivity type impurity concentration than the fourth pillar region;
a first source region of the first conductivity type provided between the first body region and the first plane; and
a second source region of the first conductivity type provided between the second body region and the first plane.

2. The semiconductor device according to claim 1, further comprising:
a second SiC region of the first conductivity type provided between the first SiC region and the second plane, the second SiC region having a lower first conductivity type impurity concentration than the first SiC region.

3. The semiconductor device according to claim 2, further comprising:
a third SiC region of the first conductivity type provided between the second SiC region and the second lane the third SiC region having a higher first conductivity type impurity concentration than the first SiC region.

4. The semiconductor device according to claim 1, wherein a distances between the first plane and ends of the fifth pillar region and the sixth pillar region close to the second plane are greater than a distance between the first plane and the end of the gate insulating film close to the second plane.

5. The semiconductor device according to claim 1, wherein a distance between the fifth pillar region and the sixth pillar region is less than a distance between the first pillar region and the second pillar region.

6. The semiconductor device according to claim 1, further comprising:
a first contact region of the second conductivity type provided between the third pillar region and the first plane, the first contact region being in contact with the third pillar region and the first plane, and the first contact region having a higher second-conductivity-type impurity concentration than the first body region; and
a second contact region of the second conductivity type provided between the fourth pillar region and the first plane, the second contact region being in contact with the fourth pillar region and the first plane, and the second contact region having a higher second-conductivity-type impurity concentration than the second body region.

7. The semiconductor device according to claim 1, further comprising:
a source electrode provided on the first plane and electrically connected to the first source region, the second source region, the third pillar region, and the fourth pillar region; and
a drain electrode provided on the second plane and electrically connected to the first SiC region.

8. The semiconductor device according to claim 1, wherein a distance between the fifth pillar region and the sixth pillar region is substantially equal to a distance between the first pillar region and the second pillar region.

9. The semiconductor device according to claim 1, wherein the first conductivity is an n type and the second conductivity is a p type.

10. The semiconductor device according to claim 1, wherein the gate insulating film is a silicon oxide film.

11. A semiconductor device comprising:
a SiC layer having a first plane and a second plane;
an n-type first SiC region provided in the SiC layer;
a p-type first pillar region provided in the first SiC region;
a p-type second pillar region provided in the first SiC region;
a p-type third pillar region provided between the first pillar region and the first plane, the third pillar region having a higher p-type impurity concentration than the first pillar region;
a p-type fourth pillar region provided between the second pillar region and the first plane, the fourth pillar region having a higher p-type impurity concentration than the second pillar region;
a gate electrode having at least a portion provided between the third pillar region and the fourth pillar region;
a p-type first body region provided between the first SiC region and the first plane, the first body region having a lower p-type impurity concentration than the third pillar region;
a p-type second body region provided between the first SiC region and the first plane, the second body region having a lower p-type impurity concentration than the fourth pillar region;
a gate insulating film provided between the first body region and the gate electrode and between the second body region and the gate electrode, a distance between the first plane and an end of the gate insulating film close to the second plane being less than distances between the first plane and ends of the third pillar region and the fourth pillar region close to the second plane;
a p-type fifth pillar region provided between the third pillar region and the gate electrode, the fifth pillar region being in contact with the third pillar region, the fifth pillar region facing the gate electrode with the first SiC region interposed therebetween, and the fifth pillar region having a lower p-type impurity concentration than the third pillar region;
a p-type sixth pillar region provided between the fourth pillar region and the gate electrode, the sixth pillar region being in contact with the fourth pillar region, the sixth pillar region facing the gate electrode with the first SiC region interposed therebetween, and the sixth pillar region having a lower p-type impurity concentration than the fourth pillar region;
an n-type first source region provided between the first body region and the first plane; and
an n-type second source region provided between the second body region and the first plane.

12. The semiconductor device according to claim 11, further comprising:
an n-type second SiC region provided between the first SiC region and the second plane, the second SiC region lower n-type impurity concentration than the first SiC region.

13. The semiconductor device according to claim 12, further comprising:
an n-type third SiC region provided between the second SiC region and the second plane, the third SiC region having a higher n-type impurity concentration than the first SiC region.

14. The semiconductor device according to claim 11, wherein a distances between the first plane and ends of the fifth pillar region and the sixth pillar region close to the second plane are greater than a distance between the first plane and the end of the gate insulating film close to the second plane.

15. The semiconductor device according to claim 11, wherein a distance between the fifth pillar region and the sixth pillar region is less than a distance between the first pillar region and the second pillar region.

16. The semiconductor device according to claim 11, wherein the n-type impurity concentration of the first SiC region is equal to or greater than $5\times10^{16}$ cm$^{-3}$ and equal to or less than $5\times10^{17}$ cm$^{-3}$.

17. The semiconductor device according to claim 12, wherein the n-type impurity concentration of the second SiC region is equal to or greater than $4\times10^{14}$ cm$^{-3}$ and equal to or less than $6\times10^{16}$ cm$^{-3}$.

18. The semiconductor device according to claim 11, wherein the p-type impurity concentration of the first and second pillar regions is equal to or greater than $1\times10^{16}$ cm$^{-3}$ and equal to or less than $1\times10^{18}$ cm$^{-3}$.

19. The semiconductor device according to claim 11, wherein the p-type impurity concentration of the third and fourth pillar regions is equal to or greater than $1\times10^{18}$ cm$^{-3}$ and equal to or less than $5\times10^{20}$ cm$^{-3}$.

20. The semiconductor device according to claim 11, wherein the p-type impurity concentration of the fifth and sixth pillar regions is equal to or greater than $1\times10^{16}$ cm$^{-3}$ and equal to or less than $1\times10^{18}$ cm$^{-3}$.

* * * * *